(12) United States Patent
Nomura et al.

(10) Patent No.: US 7,089,799 B2
(45) Date of Patent: Aug. 15, 2006

(54) PRESSURE SENSOR DEVICE AND METHOD OF PRODUCING THE SAME

(75) Inventors: Takashi Nomura, Anjo (JP); Keiji Horiba, Nishikasugai (JP); Tetsuo Fujii, Toyohashi (JP)

(73) Assignee: Denso Corporation, Kariya (JP)

( * ) Notice: Subject to any disclaimer, the term of this patent is extended or adjusted under 35 U.S.C. 154(b) by 122 days.

(21) Appl. No.: 10/744,097

(22) Filed: Dec. 24, 2003

(65) Prior Publication Data

US 2004/0163477 A1 Aug. 26, 2004

(30) Foreign Application Priority Data

Dec. 24, 2002 (JP) .............................. 2002-372094
Oct. 27, 2003 (JP) .............................. 2003-366140

(51) Int. Cl.
*G01L 7/00* (2006.01)
(52) U.S. Cl. .......................................... 73/756; 73/753
(58) Field of Classification Search .......... 73/700–756; 361/283.1, 283.2, 283.3, 283.4
See application file for complete search history.

(56) References Cited

U.S. PATENT DOCUMENTS

| | | | | |
|---|---|---|---|---|
| 5,859,759 | A | * | 1/1999 | Moriyama et al. ....... 361/283.4 |
| 6,575,038 | B1 | * | 6/2003 | Takakuwa et al. ............. 73/706 |
| 6,615,669 | B1 | | 9/2003 | Nishimura et al. |
| 2002/0050052 | A1 | | 5/2002 | Tokuhara et al. |

FOREIGN PATENT DOCUMENTS

| JP | A-8-294892 | 11/1996 |
|---|---|---|
| JP | A-10-90095 | 4/1998 |
| JP | A-2000-105161 | 4/2000 |

* cited by examiner

*Primary Examiner*—Edward Lefkowitz
*Assistant Examiner*—Jermaine Jenkins
(74) *Attorney, Agent, or Firm*—Posz Law Group, PLC

(57) ABSTRACT

A pressure sensor device having a casing (10) accommodating a sensor element (20) mounted on a mounting member (30). The casing (10) includes an opening (11) in one surface thereof. The sensor element (20) is arranged in the opening (11) for measuring the pressure outside of the casing. The casing (10) is preferably mounted on the circuit board, which is the mounting member (30). The casing (10) is mounted on the circuit board in such a state that the opening side (11) faces the circuit board.

11 Claims, 6 Drawing Sheets

PRESSURE SENSOR DEVICE AND METHOD OF PRODUCING THE SAME

CROSS REFERENCE TO RELATED APPLICATIONS

This application is based upon, claims the benefit of priority of, and incorporates by reference the contents of Japanese Patent Application No. 2002-372094 filed on Dec. 24, 2002 and Japanese Patent Application No. 2003-366140 filed on Oct. 27, 2003.

FIELD OF THE INVENTION

This invention relates to a pressure sensor device having a casing accommodating a pressure sensor element mounted on a mounting member.

BACKGROUND OF THE INVENTION

A pressure sensor device may generally include a sensor unit having a sensor element arranged in a casing with an opening in one surface thereof for measuring the pressure on the outside of the casing. The sensor unit is mounted on a mounting member such as a circuit board.

As such a pressure sensor device, a semiconductor pressure sensor comprising, for example, a pressure sensor unit accommodated in an opening of a casing which is mounted on a mounting member such as a circuit board via lead frames provided for the casing (see, for example, JP-A-10-90095) has been conceived.

The present inventors have discovered that a pressure sensor device configured as above is accompanied by the following problems. FIG. 7 is a sectional view schematically illustrating an exemplary related art semiconductor pressure sensor.

The sensor element 20 comprises a silicon chip 21 that produces an electric signal depending upon the pressure. The silicon chip 21 is secured onto a bed plate 22 such as glass. The sensor element 20 is secured by being accommodated in an opening 11 of a casing 10. The casing 10 is provided with lead frames 12 as lead members, and the sensor element 20 is electrically connected to the lead frames 12 through the bonding wires 23.

A sensor unit 40 is mounted on a mounting member 30 with an opening 11 in the casing 10 being faced to the side opposite to the mounting member 30, and is secured thereto by soldering or the like via the lead frames 12.

In the pressure sensor device, a closure 100 is mounted on the casing 10 so as to cover the opening 11 of the casing 10. The closure 100 is provided with a hole 101 for introducing the external pressure to the sensor element 20.

The closure 100 is provided for the reasons described below. First, in the step of assembling the pressure sensor device as illustrated in FIG. 8A, an adhering surface must be maintained for a mounting device K1 at the time of mounting the sensor unit 40 on the mounting member 30. The mounting device K1 operates to adhere the sensor unit 40 by utilizing a sucking force to pick it up from a pallet K2, and to mount it on the mounting member 30. Here, a closure 100 is necessary to serve as an adhering surface of the sensor unit 40 for the mounting device K1.

Second, the closure 100 is necessary for preventing the sensor element 20 from being erroneously operated by light. For example, when the sensor element 20 comprises a semiconductor such as silicon, irradiation with intense external light excites electrons in the semiconductor, thereby causing the output of the sensor element to fluctuate. As shown in FIG. 8B, the closure 100 is provided to suppress the incidence of light.

Because this pressure sensor device must include the closure 100, there is an increase in costs related to the closure 100 itself and assembling the closure 100.

Also, such a pressure sensor device including a closure may still fail to prevent passage of external light because it is likely that the external light may directly pass through the hole 101 of the closure 100 as shown in FIG. 8B and still cause erroneous operation.

SUMMARY OF THE INVENTION

In view of the above problems, therefore, it is an object of this invention to provide an inexpensive pressure sensor device without complicating the assembly process and/or impairing the sensor characteristics, and a method of suitably producing the above pressure sensor device.

In order to achieve the above object according to one aspect of this invention, there is provided a pressure sensor device comprising a casing having an opening in one surface thereof, a sensor element arranged in the opening for measuring the pressure outside of the casing, and a circuit board which is a mounting member on which the casing is mounted, wherein the casing is mounted on the mounting member in such a state that the side having the opening faces the mounting member.

Even without the closure, therefore, the surface on the side opposite to one surface of the casing, i.e., an outer surface on the bottom surface side of the opening, can be utilized as an adhering surface for the mounting device. Therefore, the sensor unit accommodating the sensor element in the casing can be suitably mounted on the circuit board, which is the mounting member.

Further, even without the closure, the opening of the casing is substantially shielded by the circuit board, which is the mounting member, and a limited amount of light falls on the sensor element through the opening of the casing. This makes it possible to lower the amount of incident light and, hence, to prevent erroneous operation.

Therefore, the present invention provides inexpensive pressure sensor device without complicating the assembly process and impairing the sensor characteristics.

According to a second aspect of the invention, there is provided a pressure sensor device of the first aspect, wherein the casing is provided with lead members, the lead members and the sensor element are electrically connected together, the casing is mounted on the mounting member via the lead members and is faced to the mounting member through a gap, and the external pressure is introduced into the casing through the gap.

Thus, the casing is suitably supported by the mounting member through the lead members, and the external pressure is introduced into the casing through the gap between the casing and the mounting member that are facing each other, enabling the pressure to be suitably detected.

According to a third aspect of this invention, there is provided a pressure sensor device comprising a casing having an opening in one surface thereof, a sensor element arranged in the opening for measuring the pressure outside of the casing, and a mounting member on which the casing is mounted, wherein the casing is mounted on the mounting member in such a state that the opening side faces the mounting member, and the external pressure is introduced into the casing through a gap between the casing and the mounting member that are facing each other.

Even without the closure, therefore, the surface on the side opposite to one surface of the casing, i.e., an outer surface on the bottom surface side of the opening, can be utilized as an adhering surface for the mounting device. Therefore, the sensor unit accommodating the sensor element in the casing can be suitably mounted on the mounting member.

Further, even without the closure, the opening of the casing is substantially shielded by the mounting member, and a very limited amount of light falls on the sensor element through the opening of the casing. This makes it possible to lower the amount of incident light and, hence, to prevent erroneous operation.

Further, the external pressure is introduced into the casing through the gap between the casing and the mounting member that are facing each other, enabling the pressure to be suitably detected.

Therefore, the present invention provides inexpensive pressure sensor device without complicating the assembly process or distorting the sensor characteristics.

According to a fourth aspect of the invention, there is provided a pressure sensor device of the third aspect, wherein the casing is provided with lead members, the lead members and the sensor element are electrically connected together, and the casing is mounted on the mounting member via the lead members.

Thus, the casing is suitably supported by the mounting member through the lead members.

According to a fifth aspect of the invention, there is provided a pressure sensor device of the second or fourth aspect in which the casing is supported via the lead members, wherein the lead members are so folded as to be interposed in a portion of the gap, and the casing and the mounting member are in contact with each other via portions of the lead members interposed in the gap.

With the lead members being folded toward the casing side, a mounting area (i.e., an area occupied thereby) of the sensor unit mounted on the mounting member can be preferably decreased.

Further, since the casing 10 and the mounting member are directly contacted to each other via portions of the lead members interposed in the gap, the casing can be more stably supported suppressing deterioration of the lead members caused by the external stress such as vibration.

According to a sixth aspect of the invention, there is provided a pressure sensor device of the second to fifth aspects, wherein the whole circumference of a portion of the casing facing the mounting member, is facing thereto being spaced apart therefrom, and a gap of the portion that is spaced apart serves as a gap.

According to a seventh aspect of the invention, there is provided a pressure sensor device of the second to fifth aspects, wherein a portion of the casing facing the mounting member, is cut away so as to be spaced apart therefrom, and the cut-away portion serves as a gap.

The gap in the pressure sensor devices of the second to fifth aspects may assume the forms of the inventions of the sixth and seventh aspects.

According to an eighth aspect of the invention, there is provided a pressure sensor device of the second or fourth aspect, wherein a portion of the casing facing the mounting member, is cut away so as to be spaced apart therefrom, the cut-away portion serves as a gap, the lead members are protruded to the outer periphery of the casing and possess portions facing the outer peripheral surface of the casing, and the cut-away portions are formed at portions of the casing to where the lead members are facing.

It is preferable that the cut-away portions are formed at portions of the casing to where the lead members are facing under the conditions where the casing is supported by the lead members, the lead members are protruding to the outer periphery of the casing and have portions facing the outer peripheral surface of the casing, and the cut-away portions are formed as gaps in the portions of the casing facing the mounting member.

The lead members exist on the outer peripheries of the cut-away portions as the gaps. When foreign matter infiltrates into the casing from the external side through the cut-away portions, the lead members work as barrier walls against the foreign matter, and no foreign matter infiltrates into the casing.

According to a ninth aspect of the invention, there is provided a pressure sensor device of the second to seventh aspects, wherein a filter member is interposed between the casing and the mounting member, the filter member having air permeability and preventing foreign matter from entering into the casing from the outer side in the gaps.

Therefore, any foreign matter is preferably prevented from infiltrating into the casing from the outer side due to the filter member.

According to a tenth aspect of the invention, there is provided a pressure sensor device of the first to ninth aspects, wherein a portion of the casing facing the mounting member is provided with a protuberance protruding toward the mounting member, a hole is formed in the mounting member in a portion to where the protuberance is facing so that the protuberance can be inserted therein, and the casing and the mounting member are positioned as the protuberance is inserted in the hole.

In mounting the sensor unit on the mounting portion, therefore, the positioning is easily accomplished between the sensor unit and the mounting member.

According to an eleventh aspect of the invention, there is provided a method of producing a pressure sensor device of the first to tenth aspects, wherein after the sensor element is disposed in the opening of the casing, the casing is faced to the mounting member and is mounted on the mounting member in a state where the other surface of the casing on the side opposite to the one surface thereof is adhered to an adhering device.

The method of producing a pressure sensor device of the present invention makes it possible to suitably produce the pressure sensor devices of the first to tenth aspects.

Reference numerals attached to the above means correspond to concrete means described in the embodiments appearing later.

DESCRIPTION OF THE PREFERRED EMBODIMENTS

Figure 1:
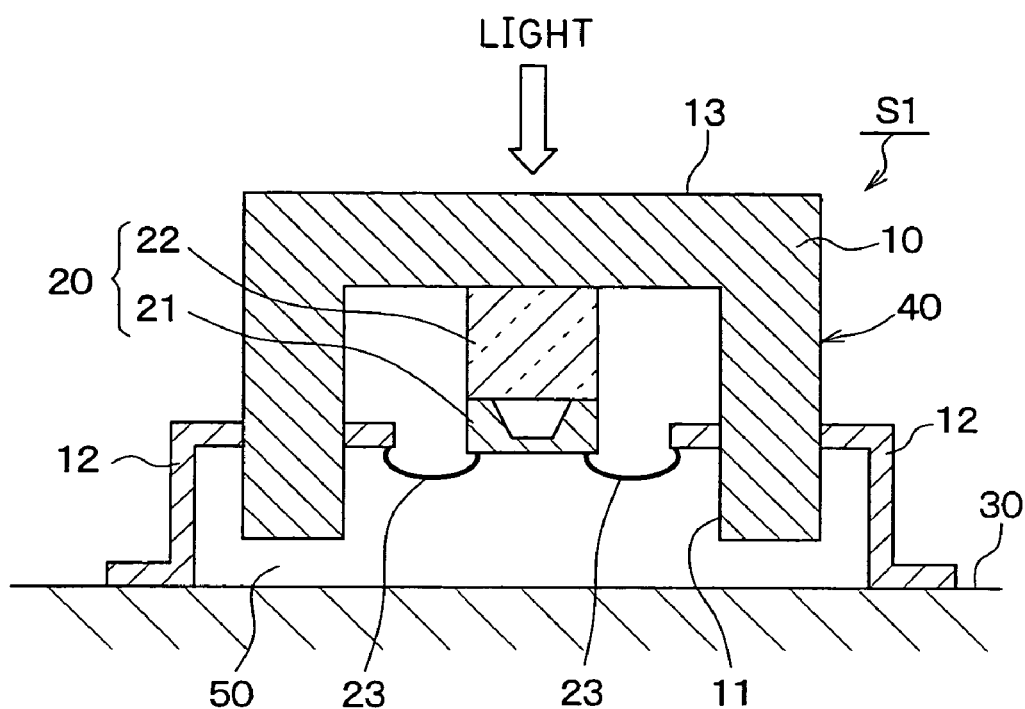
FIG. 1 is a cross sectional view of a pressure sensor device according to a first embodiment.

The invention will now be described by way of embodiments illustrated in the drawings. In the following embodiments, the same or equivalent portions are denoted by the same reference numerals to simplify the description. The various embodiments of the invention will be discussed with respect to an exemplary implementation for measuring atmospheric pressure as an external pressure. However, this exemplary implementation is discussed merely for description and is in no way limiting.

FIRST EMBODIMENT

Referring to FIG. 1, the first embodiment of a pressure sensor device S1 will be discussed. The pressure sensor device S1 comprises a casing 10 having an opening 11 in one surface thereof, a sensor element 20 arranged in the opening 11 for measuring an external pressure outside of the casing 10, i.e., for measuring the atmospheric pressure, and a mounting member 30 on which the casing 10 is mounted. The casing 10 is mounted on the mounting member 30 in such a state that the one surface side or the side having the opening 11 (opening side) faces the mounting member 30.

Here, in this embodiment, the mounting member 30 is a circuit board 30 such as a printed board or a ceramic board. However, the mounting member 30 may be any casing or any object to be measured, in addition to the circuit board.

The casing 10 may be made of a resin or ceramics, and has an opening 11 as a result of forming a recessed portion in one surface side thereof. Further, the casing 10 is provided with lead members 12. In this embodiment, lead frames 12, which are lead members 12 made of an electrically conducting material such as copper, are provided by insert-molding and are secured.

The sensor element 20 is obtained by securing a silicon chip 21 that produces an electric signal depending upon a pressure onto a bed plate 22 of a glass or the like by anodic junction or by using an adhesive. The silicon chip 21 can be realized in the form of a semiconductor diaphragm comprising a diaphragm that moves responsively to the application of pressure and a gauge resistance for detecting the movement of the diaphragm.

The sensor element 20 is accommodated in the opening 11 of the casing 10, and is secured to the casing 10 by using an adhesive or the like. The sensor element 20 and the lead frames 12 are electrically connected together by bonding wires 23 such as Au or Al.

There is thus constituted a sensor unit 40 comprising the casing 10, sensor element 20, lead frames 12 and bonding wires 23.

The sensor unit 40 is mounted on the circuit board 30 in such a state that the opening side 11 of the casing 10 faces the circuit board (mounting member) 30, and is secured to the circuit board 30 by soldering or the like via the lead frames 12.

Namely, in the pressure sensor device S1, the sensor unit 40 is constituted as a surface mounted part (SMD), which is mounted on the circuit board 30.

The casing 10 is mounted on, and supported by, the circuit board 30, which is the mounting member through the lead frames 12 which are the lead members. The circuit board 30 and the casing 10 are facing each other via the gap 50.

Here, in this embodiment, the whole circumference of a portion of the casing 10 facing the circuit board 30, is facing thereto being spaced apart therefrom, and a gap of the portion that is spaced apart serves as the gap 50.

In this pressure sensor device S1, the atmospheric pressure is introduced into the opening 11 through the gap 50 between the casing 10 and the circuit board 30 that are facing each other. That is, the atmospheric pressure is introduced to the sensor element 20 in the opening 11 through the gap between the circuit board 30 and the edge of the opening 11 facing thereto.

An electric signal is output from the sensor element 20 depending upon the atmospheric pressure, and is transmitted to the circuit board 30 through the bonding wire 23 and the lead frame 12. The transmitted electric signal is amplified or adjusted through the circuit board 30 to measure the atmospheric pressure.

Upon providing the sensor element 20 with a circuit portion, it also becomes possible to amplify or adjust the electric signals on the side of the sensor element 20.

In mounting the sensor unit 40 on the circuit board 30 in the step of assembling the pressure sensor device S1, the outer surface 13 on the bottom surface side of the opening 11 of the casing 10 becomes the adhering surface for the mounting device.

Figure 2:
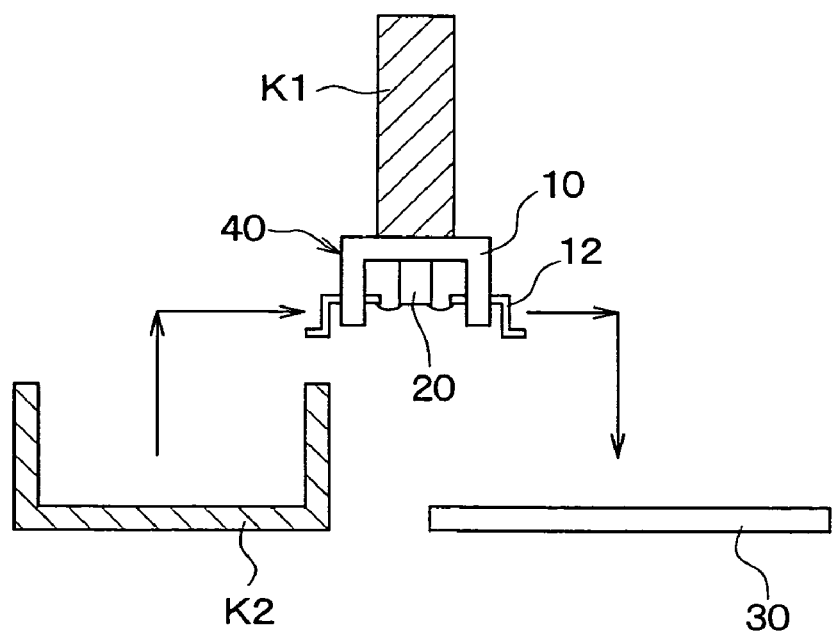
FIG. 2 is a view illustrating a step of assembling the pressure sensor device shown in FIG. 1.

More particularly, as shown in FIG. 2, the mounting device K1 is brought into contact with the outer surface 13 on the bottom surface side of the opening 11 of the casing 10 to adhere it thereto by, for example, suction, whereby the sensor unit 40 placed on the pallet K2 is picked up from the pallet K2, and is mounted on the circuit board 30. Thereafter, the sensor unit 40 is secured onto the circuit board 30 by reflowing the solder.

According to the pressure sensor device S1 of this embodiment, the casing 10 is mounted on the circuit board 30 in such a state that the opening side 11 faces the circuit board (mounting member) 30. Even without the closure, therefore, the outer surface 13 of the casing 10 is utilized as the adhering surface to suitably mount the sensor unit 40 on the circuit board 30.

As shown in FIG. 1, even without the closure, the opening 11 of the casing 10 is shielded by the circuit board (mounting member) 30, so that only a very limited amount of light falls on the sensor element 20 through the opening 11 of the casing 10. This makes it possible to lower the amount of incident light and, hence, to prevent erroneous operation.

According to this embodiment, further, the atmospheric pressure, which is the external pressure, can be introduced into the casing 10 through the gap 50 between the casing 10 and the circuit board (mounting member) 30 that are facing each other, thereby enabling the pressure to be suitably detected.

According to this embodiment, as described above, it is allowed to employ the constitution without the closure and, hence, to decrease the cost of the closure and of assembling the closure, without impairing the function of the closure as the adhering surface or the light-shielding function. Thus, there can be provided a pressure sensor device S1 less expensive than those of the prior art without impairing easiness of assembling and sensor characteristics.

In the pressure sensor device S1 of this embodiment, further, the casing 10 is provided with lead frames 12 which are the lead members, and is mounted on the circuit board (mounting member) 30 via the lead frames 12. Therefore, the casing 10 and the circuit board 30 are facing each other via the gap 50.

Thus, the casing 10 is suitably supported by the circuit board 30 via the lead frames 12, while forming a suitable gap 50 between the casing and the mounting member that are facing each other.

According to this embodiment, further, there is provided, as described with reference to FIG. 2, a method of producing the pressure sensor device S1, wherein after the sensor element 20 is disposed in the opening 11 of the casing 10, the casing 10 is faced to the circuit board (mounting member) 30 and is mounted on the circuit board 30 in a state where the other surface of the casing 10 on the side opposite to the one surface thereof is adhered to the mounting device K1. More particularly, the outer surface 13 on the bottom surface side of the opening 11 of the casing 10 is adhered to the mounting device K1, which is preferably a pressure suction device.

This production method makes it possible to suitably produce the pressure sensor device S1 of this embodiment.

SECOND EMBODIMENT

Figure 3:
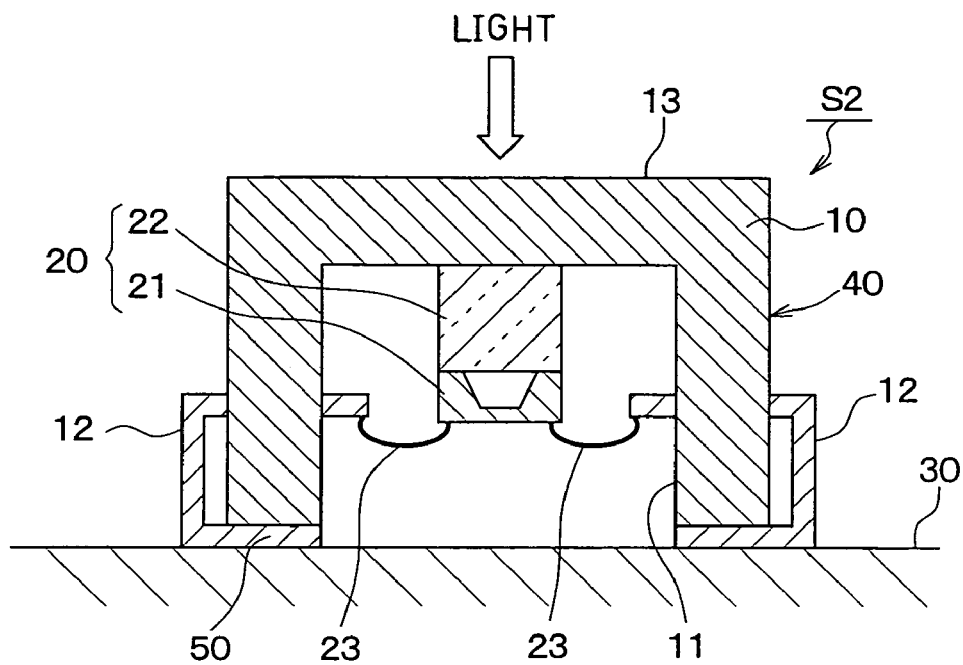
FIG. 3 is a cross sectional view of the pressure sensor device according to a second embodiment.

Referring now to FIG. 3, a second embodiment of the invention of the pressure sensor device S2 will be discussed by primarily highlighting differences with the above first embodiment. The lead frames 12, which are the lead members, are folded so as to be interposed in a portion of the gap 50. The casing 10 is in contact with the circuit board 30, which is the mounting member, via portions of the lead frames 12 interposed in the gap 50.

In this case, a portion of the gap 50 where no lead frame 12 is interposed works as the gap 50 for introducing the atmospheric pressure.

This embodiment exhibits the same action and effect as those of the above first embodiment. The lead frames 12 are preferably folded toward the side of the casing 10 instead of toward the side opposite to the casing 10 of the first embodiment. Therefore, a decreased mounting area or a decreased area occupied to mount the sensor unit 40 on the circuit board 30 is used.

Further, since the casing 10 and the circuit board 30 are directly contacted to each other via portions of the lead frames 12 interposed in the gap 50, the casing 10 can be more stably supported as compared to the first embodiment in which the casing 10 is floating on the circuit board 30. This suppresses the deterioration of the lead frames 12 caused by external stress such as vibration. More particularly, folded portions of the lead frames 12 are suppressed from being broken in case vibration is exerted, minimizing the breakage in the junction portion between the lead frames 12 and the circuit board 30, and in the connection portion between the lead frames 12 and the bonding wires 23.

THIRD EMBODIMENT

Figure 4A:
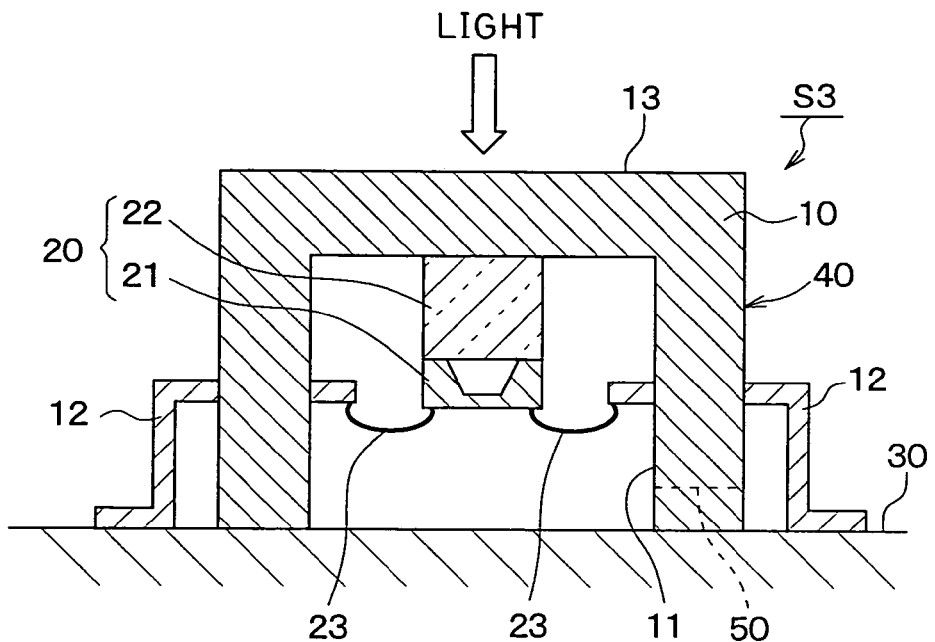
FIG. 4A a cross sectional view of the pressure sensor device according to a third embodiment.
Figure 4B:
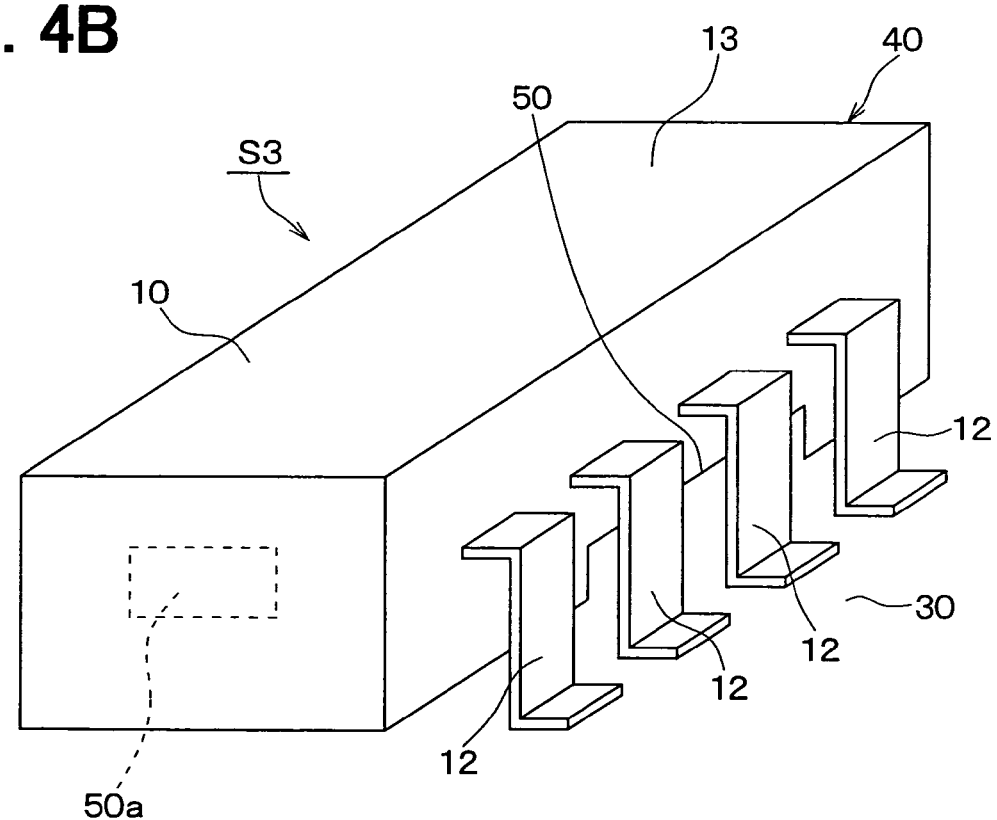
FIG. 4B is a perspective view illustrating the appearance of the pressure sensor device of FIG. 4A.

Referring to FIGS. 4A–4B, the pressure sensor device S3 according to a third embodiment will be discussed. A portion of the casing 10 facing the circuit board 30, which is the mounting member, is cut away so as to be spaced apart from the circuit board 30. This cut-away portion 50 serves as a gap.

In the above embodiment, the whole circumference (outer peripheral edges) of the casing 10 faces the circuit board 30. A portion of this whole circumference is spaced apart from the circuit board 30 to serve as the gap 50. The gap 50 may be formed in the portions of the casing 10 facing the circuit board 30 and the other portions may be in contact with the circuit board 30.

The atmospheric pressure, which is the external pressure, can be introduced into the casing 10 through the cut-away portion 50 to suitably detect the pressure. This embodiment exhibits actions and effects similar to those of the first embodiment.

In the embodiment illustrated in FIGS. 4A–4B, the lead frames 12 are protruded to the outer periphery of the casing 10 and possess portions facing the outer peripheral surface of the casing 10, and the cut-away portions 50 are formed at portions of the casing 10 to where the lead frames 12 are facing.

In the embodiment illustrated in FIGS. 4A–4B, it is preferable that the cut-away portions 50 be formed at portions of the casing 10 where the lead frames 12 are disposed when the casing 10 is supported by the lead frames 12. It is also preferable that the lead frames 12 protrude to the outer periphery of the casing 10 and have portions facing the outer peripheral surface of the casing 10 and that the cut-away portions 50 be formed in the casing 10.

The lead frames 12 are disposed on the outer peripheries of the cut-away portions 50. When foreign matter infiltrates into the casing 10 from the external side through the cut-away portions 50, the lead frames 12 act as barrier walls against the foreign matter, and no foreign matter infiltrates into the casing 10.

Alternatively to the cut-away portion 50, an opening 50a may be formed in the casing 10 as represented by a broken line in FIG. 4B. This opening 50a may be used as the gap.

FOURTH EMBODIMENT

Figure 5:
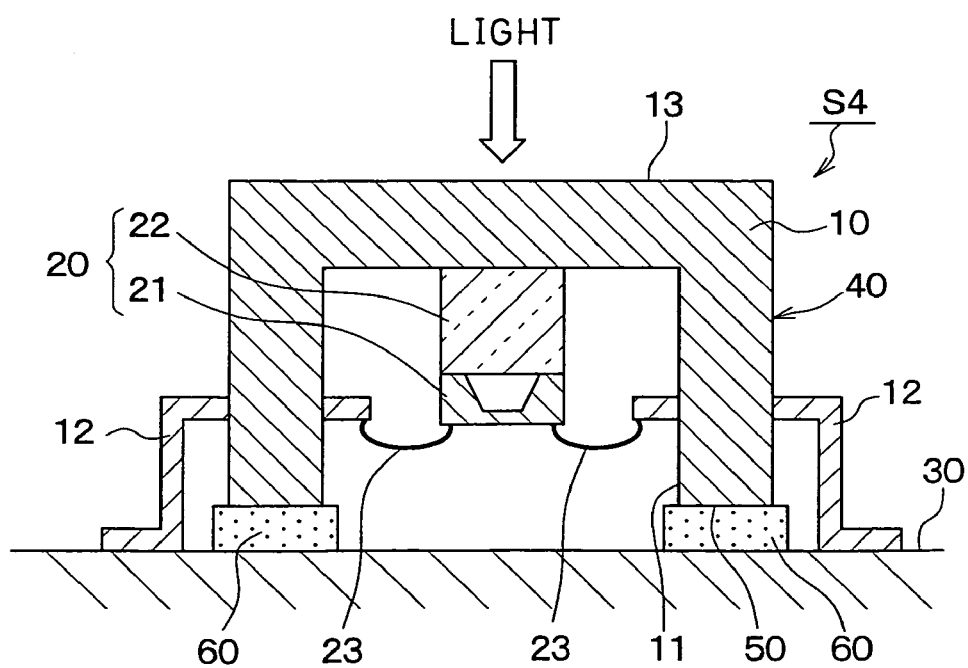
FIG. 5 is a cross sectional view of the pressure sensor device according to a fourth embodiment.

Referring to FIG. 5, the pressure sensor device S4 according to a fourth embodiment of the invention will be discussed. The pressure sensor device S4 includes a filter member 60 interposed in the gap 50 between the casing 10 and the circuit board (mounting member) 30, the filter member 60 has air permeability and prevents foreign matter from entering into the casing 10 from the outer side.

Concretely speaking, the filter member 60 is made of a material that is usually used as an air filter, such as a resin or a fibrous material having air permeability.

This embodiment exhibits the action and effect same as those of the first embodiment, and preferably prevents any foreign matter from infiltrating into the casing 10 from the outer side through the gap 50 due to the filter member 60.

FIFTH EMBODIMENT

Figure 6A:
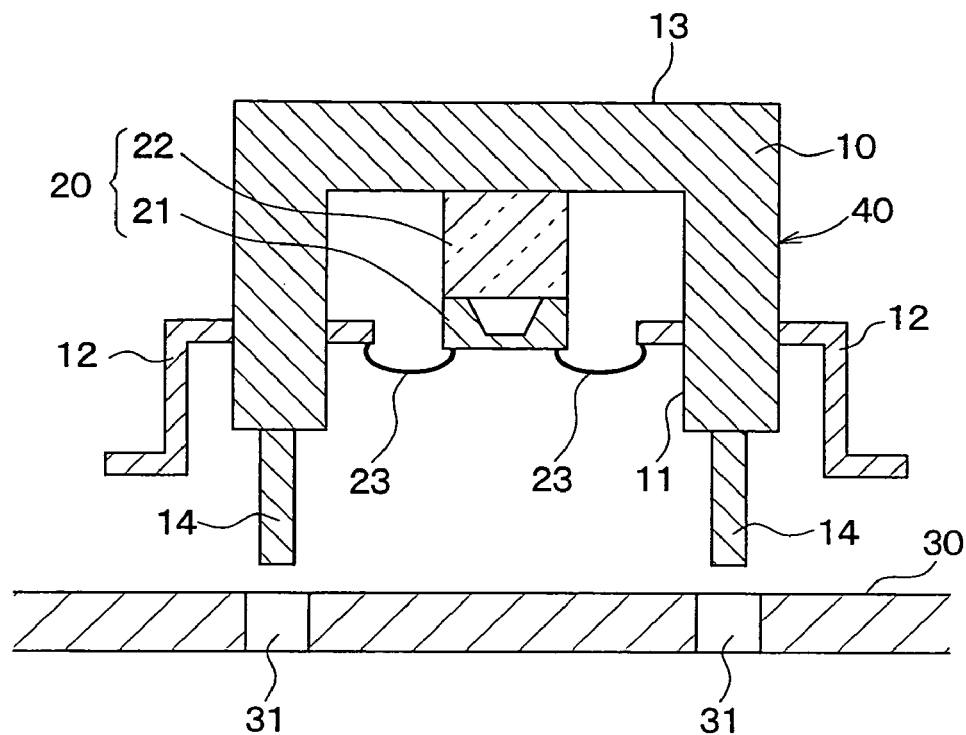
FIG. 6A is a sectional view of the pressure sensor device according to a fifth embodiment in a state before a sensor unit and a circuit board are assembled.
Figure 6B:
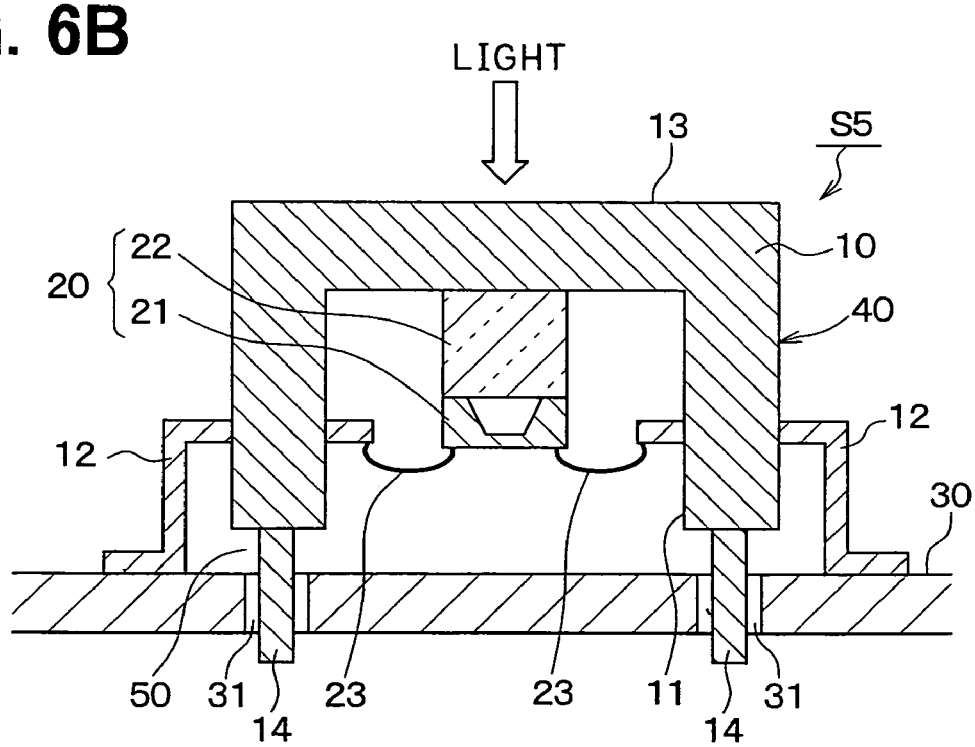
FIG. 6B is a sectional view schematically illustrating the pressure sensor device according to the fifth embodiment.
Figure 7:
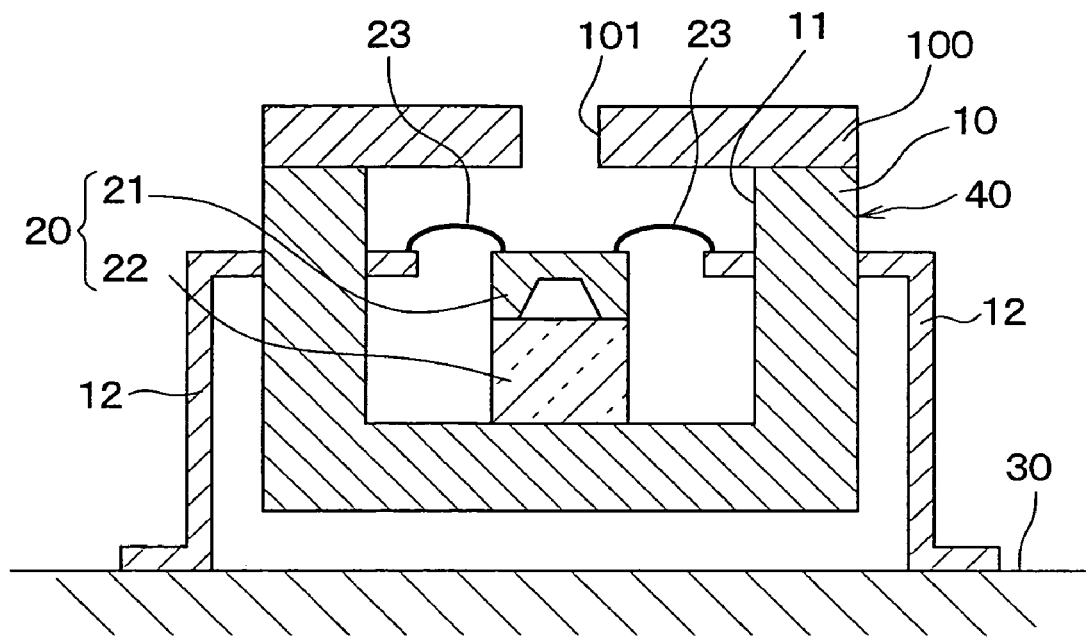
FIG. 7 is a sectional view schematically illustrating a related art semiconductor pressure sensor.
Figure 8A:
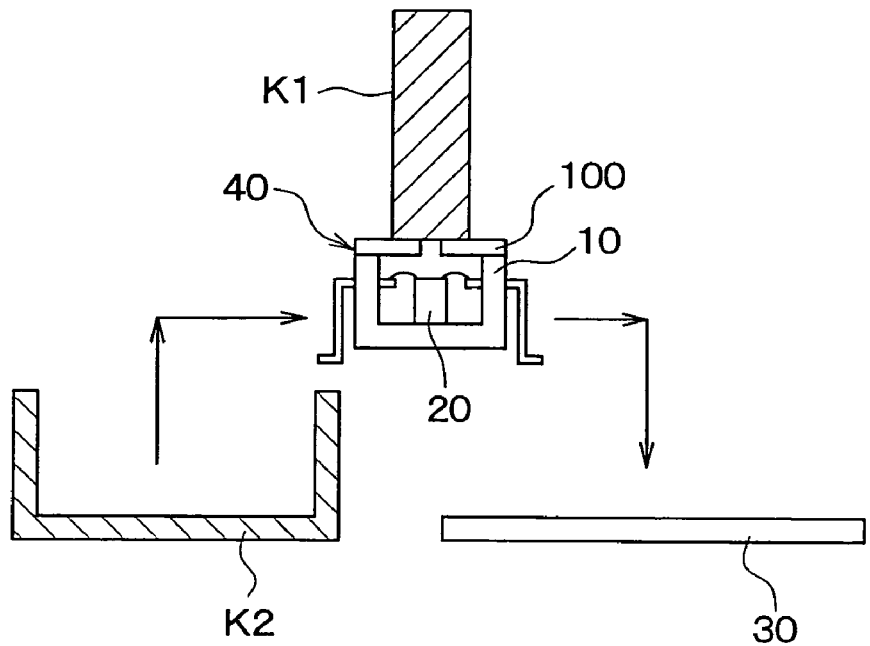
FIG. 8A is a view illustrating the step of assembling a the pressure sensor of FIG. 7.
Figure 8B:
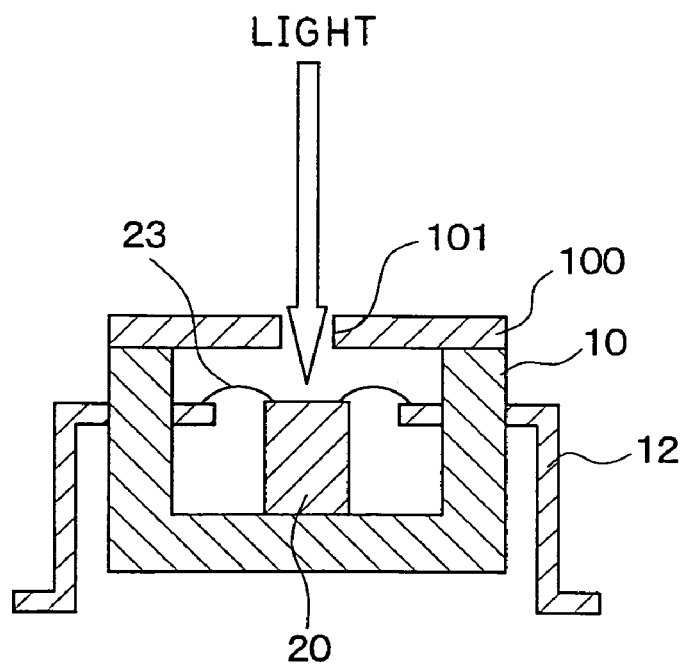
FIG. 8B is a view illustrating a state where light is incident on the related art pressure sensor device.

Referring to FIGS. 6A–6B, a pressure sensor device S5 according to a fifth embodiment of the invention will be discussed. FIG. 6A illustrates the pressure sensor device S5 in a state before the sensor unit 40 and the circuit board 30 are assembled. FIG. 6B is a sectional view schematically illustrating the pressure sensor device S5.

As shown in FIG. 6A, a portion of the casing 10 facing the circuit board (mounting member) 30 is provided with a protuberance 14 protruding toward the circuit board 30. A hole 31 is formed in the circuit board 30 in a portion where the protuberance 14 is facing so that the protuberance 14 can be inserted therein. The casing 10 and the circuit board 30 are positioned as the protuberance 14 is inserted in the hole 31.

This embodiment exhibits the same effect and action as those of the first embodiment. In mounting the sensor unit 40 on the circuit board (mounting member) 30, therefore, the positioning is easily accomplished between the sensor unit 40 and the circuit board 30.

In the embodiment shown in FIGS. 6A–6B, the hole 31 is a through hole penetrating through the circuit board 30 in the direction of thickness. The hole 31, however, may be of a recessed shape that is recessed from the surface of the circuit board 30 that faces the sensor unit 40.

The description of the invention is merely exemplary in nature and, thus, variations that do not depart from the gist of the invention are intended to be within the scope of the invention. Such variations are not to be regarded as a departure from the spirit and scope of the invention. For example, the above embodiments may be suitably combined together in a range in which they can be put into practice. The pressure sensor may possess a sensor element in the opening of the casing in addition to the atmospheric pressure sensor, and can be applied to the pressure sensor device designed for measuring the pressure on the outside of the casing.

What is claimed is:

1. A pressure sensor device comprising:
a casing having an opening side in one surface thereof;
a sensor element arranged in the opening side for measuring an external pressure that is outside of the casing; and
a mounting member on which the casing is mounted,
wherein the casing is mounted on the mounting member in such a state that the opening side faces the mounting member,
wherein the external pressure is introduced into the casing through a gap between the casing and the mounting member that are facing each other,
wherein the casing is provided with lead members, and wherein the lead members and the sensor element are electrically connected together and the casing is mounted on the mounting member via the lead members, and
wherein the lead members are folded to be interposed in a portion of the gap, and the casing and the mounting member are in contact with each other via portions of the lead members interposed in the gap.

2. A pressure sensor device comprising:
a casing having an opening side in one surface thereof;
a sensor element arranged in the opening side for measuring an external pressure that is outside of the casing; and
a mounting member on which the casing is mounted,
wherein the casing is mounted on the mounting member in such a state that the opening side faces the mounting member,
wherein the external pressure is introduced into the casing through a gap between the casing and the mounting member that are facing each other, and
wherein a portion of the casing facing the mounting member is cut away so as to be spaced apart therefrom to form a cut-away portion that serves as a gap.

3. A pressure sensor device comprising:
a casing having an opening side in one surface thereof;
a sensor element arranged in the opening side for measuring an external pressure that is outside of the casing; and
a mounting member on which the casing is mounted,
wherein the casing is mounted on the mounting member in such a state that the opening side faces the mounting member,
wherein the external pressure is introduced into the casing through a gap between the casing and the mounting member that are facing each other, and
wherein a portion of the casing facing the mounting member is cut away so as to be spaced apart therefrom, the cut-away portion serves as a gap, the lead members are protruded to the outer periphery of the casing and possess portions facing the outer peripheral surface of the casing, and the cut-away portion is formed at a portion of the casing facing the lead members.

4. A pressure sensor device comprising:
a casing having an opening side in one surface thereof;
a sensor element arranged in the opening side for measuring an external pressure that is outside of the casing; and
a mounting member on which the casing is mounted,
wherein the casing is mounted on the mounting member in such a state that the opening side faces the mounting member,
wherein the external pressure is introduced into the casing through a gap between the casing and the mounting member that are facing each other, and
wherein a portion of the casing facing the mounting member is provided with a protuberance protruding toward the mounting member, wherein a hole is disposed in the mounting member in a portion to where the protuberance is facing so that the protuberance can be inserted therein, and wherein the casing and the mounting member are positioned as the protuberance is inserted in the hole.

5. A pressure sensor device comprising:
a casing having an opening side in one surface thereof;
a sensor element arranged in the opening side for measuring an external pressure that is outside of the casing; and
a mounting member on which the casing is mounted,
wherein the casing is mounted on the mounting member in such a state that the opening side faces the mounting member,
wherein the external pressure is introduced into the casing through a gap between the casing and the mounting member that are facing each other, and
wherein after the sensor element is disposed in the opening of the casing, the casing is faced to the mounting member and is mounted on the mounting member in a state where the other surface of the casing on the side opposite to the one surface thereof is adhered to an adhering device.

6. A pressure sensor device comprising:
a casing having an opening side in one surface thereof;
a sensor element arranged in the opening side for measuring an external pressure outside of the casing; and
a mounting member on which the casing is mounted in a state in which the opening side faces the mounting member, wherein the mounting member comprises a circuit board,
wherein the casing is provided with lead members, and wherein the lead members and the sensor element are electrically connected together,
wherein the casing is mounted on and supported by the mounting member via the lead members, wherein the casing faces the mounting member through a gap, and the external pressure is introduced into the casing through the gap, and wherein the lead members are folded to be interposed in a portion of the gap, and the casing and the mounting member are in contact with each other via portions of the lead members interposed in the gap.

7. A pressure sensor device comprising:

a casing having an opening side in one surface thereof;

a sensor element arranged in the opening side for measuring an external pressure outside of the casing; and a mounting member on which the casing is mounted in a state in which the opening side faces the mounting member, wherein the mounting member comprises a circuit board, wherein the casing is provided with lead members, and wherein the lead members and the sensor element are electrically connected together, wherein the casing is mounted on and supported by the mounting member via the lead members, wherein the casing faces the mounting member through a gap, and the external pressure is introduced into the casing through the gap, and wherein a whole circumference of a portion of the casing facing the mounting member is spaced apart from the casing to provide a gap.

8. A pressure sensor device comprising:

a casing having an opening side in one surface thereof;

a sensor element arranged in the opening side for measuring an external pressure outside of the casing; and a mounting member on which the casing is mounted in a state in which the opening side faces the mounting member, wherein the mounting member comprises a circuit board, wherein the casing is provided with lead members, and wherein the lead members and the sensor element are electrically connected together, wherein the casing is mounted on and supported by the mounting member via the lead members, wherein the casing faces the mounting member through a gap, and the external pressure is introduced into the casing through the gap, and wherein a portion of the casing facing the mounting member is cut away so as to be spaced apart therefrom to form a cut-away portion that serves as a gap.

9. A pressure sensor device comprising:

a casing having an opening side in one surface thereof;

a sensor element arranged in the opening side for measuring an external pressure outside of the casing; and a mounting member on which the casing is mounted in a state in which the opening side faces the mounting member, wherein the mounting member comprises a circuit board, wherein the casing is provided with lead members, and wherein the lead members and the sensor element are electrically connected together, wherein the casing is mounted on and supported by the mounting member via the lead members, wherein the casing faces the mounting member through a gap, and the external pressure is introduced into the casing through the gap, and wherein a portion of the casing facing the mounting member is cut away so as to be spaced apart therefrom, the cut-away portion serves as a gap, the lead members are protruded to the outer periphery of the casing and possess portions facing the outer peripheral surface of the casing, and the cut-away portion is formed at a portion of the casing facing the lead members.

10. A pressure sensor device comprising:

a casing having an opening side in one surface thereof;

a sensor element arranged in the opening side for measuring an external pressure outside of the casing; and a mounting member on which the casing is mounted in a state in which the opening side faces the mounting member, wherein the mounting member comprises a circuit board, wherein a portion of the casing facing the mounting member is provided with a protuberance protruding toward the mounting member, wherein a hole is disposed in the mounting member in a portion to where the protuberance is facing so that the protuberance can be inserted therein, and wherein the casing and the mounting member are positioned as the protuberance is inserted in the hole.

11. A pressure sensor device comprising:

a casing having an opening side in one surface thereof;

a sensor element arranged in the opening side for measuring an external pressure outside of the casing; and a mounting member on which the casing is mounted in a state in which the opening side faces the mounting member, wherein the mounting member comprises a circuit board, wherein after the sensor element is arranged in the opening of the casing, the casing is faced to the mounting member and is mounted on the mounting member in a state where the other surface of the casing on the side opposite to the one surface thereof is adhered to an adhering device.

* * * * *